(12) United States Patent
Yu (10) Patent No.: US 8,179,163 B2
(45) Date of Patent: May 15, 2012

(54) METHOD AND APPARATUS FOR CHARGE PUMP LINEARIZATION IN FRACTIONAL-$N$ PLLS

(75) Inventor: Qicheng Yu, Lexington, MA (US)

(73) Assignee: Silicon Laboratories Inc., Austin, TX (US)

( * ) Notice: Subject to any disclaimer, the term of this patent is extended or adjusted under 35 U.S.C. 154(b) by 79 days.

(21) Appl. No.: 12/732,024

(22) Filed: Mar. 25, 2010

(65) Prior Publication Data

US 2011/0234272 A1 Sep. 29, 2011

(51) Int. Cl.
*H03D 13/00* (2006.01)
*G01R 25/00* (2006.01)

(52) U.S. Cl. ............ 327/12; 327/2; 327/3; 327/5; 327/7; 327/10; 331/25

(58) Field of Classification Search .................. 327/2, 3, 327/5, 7–10, 12; 331/25
See application file for complete search history.

(56) References Cited

U.S. PATENT DOCUMENTS

| | | | | |
|---|---|---|---|---|
| 5,124,594 A * | 6/1992 | Numata et al. | .................... | 327/7 |
| 5,436,596 A | 7/1995 | Folmer | | |
| 6,130,561 A | 10/2000 | Dufour | | |
| 6,590,426 B2 | 7/2003 | Perrott | | |
| 7,068,110 B2 | 6/2006 | Frey et al. | | |
| 7,250,808 B2 | 7/2007 | Yoshimura | | |
| 7,400,204 B2 | 7/2008 | Thomsen et al. | | |
| 7,728,631 B2 * | 6/2010 | Nathawad | ........................ | 327/12 |
| 7,791,378 B1 * | 9/2010 | Sutardja et al. | .................. | 327/12 |
| 2003/0222723 A1 | 12/2003 | Kawahara | | |
| 2007/0126484 A1 | 6/2007 | Lin et al. | | |
| 2008/0211588 A1 | 9/2008 | Frey et al. | | |
| 2009/0285279 A1 | 11/2009 | Nathawad | | |

OTHER PUBLICATIONS

Zhang, G., "Linearised Charge Pump Independent of Current Mismatch Through Timing Rearrangement," Electronics Letters, vol. 46, No. 1, Jan. 7, 2010, 2 pages.
Baird, R. and Fiez, T., "Improved ΔΣ DAC linearity using data weighted averaging", Proc. IEEE Internat. Symposium on Circuits and Systems, pp. 13-16, May 1995.
M. Gupta, and Song, B., "A 1.8 GHz spur cancelled fractional-N frequency synthesizer with LMS based DAC gain calibration," IEEE J. Solid-State Circuits, vol. 41, No. 12, pp. 2842-2851, Dec. 2006.
Pamarti, S. et al., "A wideband 2.4 GHz delta-sigma fractional-N PLL with 1-Mb/s in-loop modulation," IEEE J. Solid-State Circuits, vol. 39, No. 1, pp. 49-62, Jan. 2004.
S. Meninger, and Perrott, M., "A 1 MHz bandwidth 3.6 GHz 0.18 μm CMOS fractional-N synthesizer utilizing a hybrid PFD/DAC structure for reduced broadband phase noise," IEEE J. Solid-State Circuits, vol. 41, No. 4, pp. 966-980, Apr. 2006.

(Continued)

*Primary Examiner* — Patrick O'Neill
(74) *Attorney, Agent, or Firm* — Zagorin O'Brien Graham LLP (57) ABSTRACT

Efficient techniques improve the linearity of a charge pump in fractional-N PLLs. A feedback clock pulse several VCO clock periods wide is formed and supplied to a phase frequency detector (PFD). The down pulse generated by the PFD is fixed to eliminate the nonlinearity associated with up and down current source mismatch. The up pulse is made to fall when the down pulse falls, that is, when the feedback clock pulse falls.

16 Claims, 5 Drawing Sheets

OTHER PUBLICATIONS

S. Meninger, and Perrott, M., "A fractional-N frequency synthesizer architecture utilizing a mismatch compensated PFD/DAC structure for reduced quantization-induced phase noise," IEEE Trans. Circuits Syst. II, Analog Digit. Signal Process., vol. 50, No. 11, pp. 839-849, Nov. 2003.

Swaminathan, A. et al., "A wide-bandwidth 2.4GHz ISM-band fractional-N PLL with adaptive phase-noise cancellation," IEEE J. Solid-State Circuits, vol. 42, No. 12, pp. 2639-2650, Dec. 2007.

Temporiti, E. et al., "A 700kHz bandwidth ΣΔ fractional synthesizer with spurs compensation and linearization techniques for WCDMA applications," IEEE J. Solid-State Circuits, vol. 39, No. 8, pp. 1446-1454, Sep. 2004.

Zhang, L. et al., "A hybrid spur compensation technique for finite modulo fractional-N phase-locked loops," IEEE J. Solid-State Circuits, vol. 44, No. 11, pp. 2922-2934, Nov. 2009.

European Extended Search Report and Written Opinion mailed Jul. 13, 2011 in EP App. No. 11159357.0, 7 pages.

U.S. Appl. No. 12/732,029, filed Mar. 25, 2010, entitled "Method and Apparatus for Quantization Noise Reduction in Fractional-N PLLS" by inventor Qicheng Yu.

* cited by examiner

$\ll r$ : left-shift by $r$ bits.

METHOD AND APPARATUS FOR CHARGE PUMP LINEARIZATION IN FRACTIONAL-N PLLS

CROSS-REFERENCE TO RELATED APPLICATION(S)

This application is related to application Ser. No. 12/732,029, filed on the same date as the present application, entitled "METHOD AND APPARATUS FOR QUANTIZATION NOISE REDUCTION IN FRACTIONAL-N PLLS," naming Qicheng Yu as inventor, which application is incorporated herein by reference in its entirety.

BACKGROUND

1. Field of the Invention

This application relates to fractional-N phase-locked loops and more particularly to correcting shortcomings in such phase-locked loops (PLLs).

2. Description of the Related Art

Wide band fractional-N PLLs see increasing demand in various fields, especially wireless communications. Large bandwidth of the PLL helps suppress the intrinsic noise of the VCO, and provides fast settling time during frequency switching.

Unlike an integer-N PLL, the feedback divider output clock (fbclk) leads and lags the reference clock (refclk) regularly in a fractional-N PLL due to an ever-changing frequency divider ratio. The change is necessary to maintain an average VCO clock to reference clock frequency ratio that contains a fraction. This quantization noise of the feedback clock phase is injected through the phase-frequency detector (PFD) and charge pump (CP), and easily becomes the dominant noise source of the system. Meanwhile, the CP exhibits nonlinearity, mainly due to the size mismatch between the up and down current sources. High frequency quantization noise is modulated by the nonlinearity down into the pass band of the PLL, corrupting the output clock.

Figure 1A:
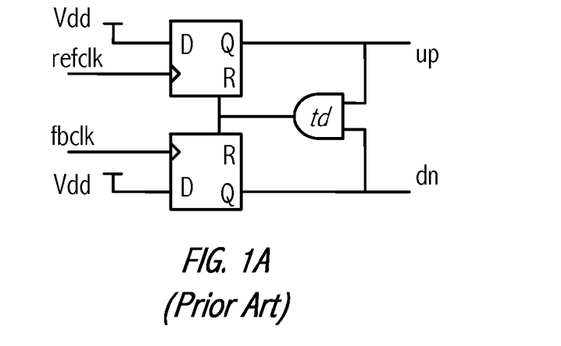
FIG. 1A illustrates a typical PFD used to drive a charge pump in a PLL.
Figure 1B:
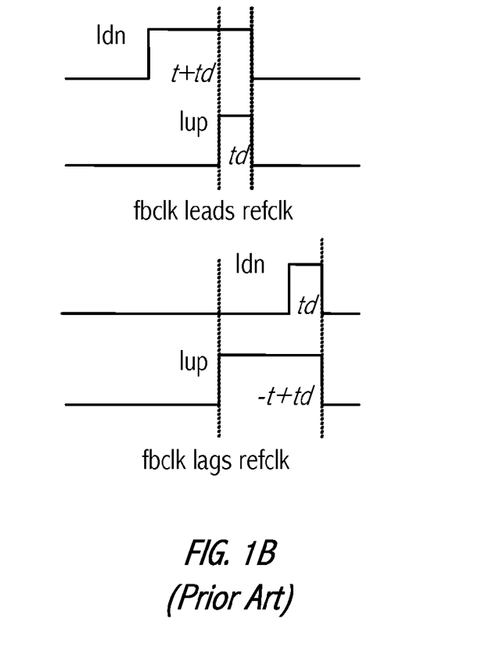
FIG. 1B illustrates a timing diagram associated with the PFD of FIG. 1A.

Referring to FIG. 1, illustrated is a typical tri-state PFD used to drive the charge pump of a PLL. In locked steady state operation, the rising edge of the refclk triggers the up output pulse and the rising edge of the fbclk triggers the down output pulse. A short delay after both pulses rise, the PFD is reset and both pulses clear simultaneously (FIG. 1(b)). The total charge Q delivered by the charge pump to the loop filter is $$Q = I_{up} \cdot t_d - I_{dn} \cdot t - I_{dn} \cdot t_d$$

when fbclk leads, and $$Q = I_{up} \cdot (-t) + I_{up} \cdot t_d - I_{dn} \cdot t_d$$

when fbclk lags. Here t is the time by which the fbclk leads refclk, $t_d$ is the delay of reset in the PFD, and $I_{up}$ and $I_{du}$ are the value of up and down current sources. Q is nonlinear with respect to t if $I_{up} \neq I_{dn}$, causing the high frequency quantization noise in the phase of fbclk to alias into the PLL bandwidth.

Figure 1C:
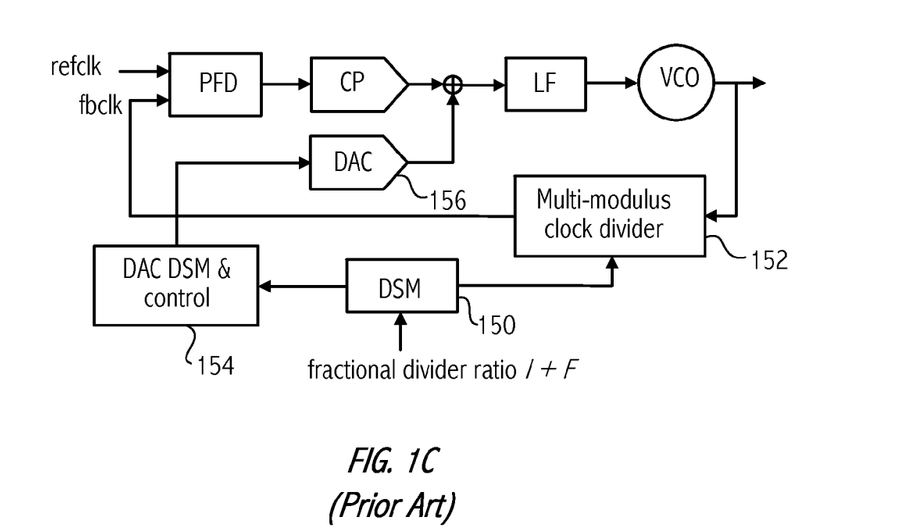
FIG. 1C illustrates a quantization noise reduction technique using a dedicated noise canceling DAC.

Another source of error as described above is the quantization noise due to the feedback divider output clock (fbclk) leading and lagging the reference clock (refclk) regularly in a fractional-N PLL due to an ever-changing frequency divider ratio. The common approach to quantization noise reduction is to add dedicated current sources to implement a canceling digital to analog converter (DAC), which delivers a charge that is nearly the opposite of the quantization noise. A typical fractional-N PLL with quantization noise reduction is shown in FIG. 1C. The delta-sigma modulator (DSM) 150 not only determines the instantaneous feedback divider ratio for multi-modulus divider 152, but also provides the phase difference of the fbclk relative to the refclk for the digital control circuit 154 for the cancellation digital to analog converter (DAC) 156. The DAC 156 is typically a separate bank of current sources, each of which may turn on for a short duration that is approximately aligned with the charge pump (CP) current pulses. The DAC is controlled by a second delta-sigma modulator (DAC DSM) 154 that modulates its own quantization noise out of the PLL pass band. The penalties to pay for the added circuit components include thermal and 1/f noise, switch charge injection, error charge due to component mismatch, device leakage current and supply current. While the average total current is zero, the different current pulses have different amplitude, duration and skew, resulting in residual noise at high frequencies.

Thus, improvements at controlling noise, charge injection, mismatch error and leakage current in a PLL are desirable.

SUMMARY

Accordingly, an embodiment of the invention provides a method that includes receiving a feedback signal having a fixed pulse width at a first input of a phase frequency detector. Responsive to assertion of the feedback signal, a first pulse signal is asserted that is indicative of a first charge amount. A reference clock signal is received at a second input of the phase frequency detector. Responsive to assertion of the reference clock signal, a second pulse signal is asserted indicating a second charge amount. The first and second pulse signals are deasserted in response to the falling edge of the feedback signal.

In an embodiment, when the reference clock signal lags the feedback signal by more than the fixed pulse width, the first pulse signal is extended so that the first pulse signal falls together with the second pulse signal, a fixed delay after the second pulse signal rises.

In another embodiment, an apparatus includes a phase frequency detector (PFD). The phase frequency detector (PFD) includes a first circuit coupled to receive a fixed pulse width feedback signal and to supply a first pulse signal having a fixed pulse width corresponding to the fixed pulse width feedback signal. A first edge of the first pulse signal is determined by a first edge of the fixed pulse width feedback signal and a second edge of the first pulse signal being determined by a reset signal. A second circuit is coupled to receive a reference clock signal and to supply a second pulse signal. A first edge of the second pulse signal is determined by a first edge of the reference clock signal and a second edge of the second pulse signal is determined by the reset signal. A reset circuit is responsive to a predetermined edge of the fixed pulse width feedback signal to generate the reset signal.

In another embodiment, a linearizing phase frequency detector is provided that includes a first pulse signal generating circuit responsive to a feedback pulse having a fixed width to generate a first pulse signal with a first and second edge defining the first pulse signal and having substantially the same fixed width as the feedback pulse. A second pulse signal generating circuit is responsive to a reference clock signal to generate a first edge of a second pulse signal on assertion of the reference clock signal and to generate a second edge of the second pulse signal responsive to deassertion of the feedback pulse.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 2:
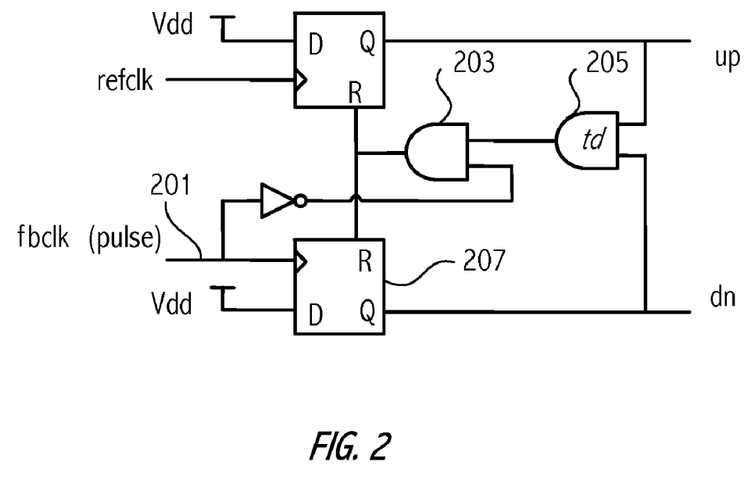
FIG. 2 illustrates a linearizing PFD according to an embodiment of the invention.

Referring to FIG. 2, a linearizing PFD is illustrated that provides charge pump linearization to address mismatch nonlinearity according to an embodiment of the invention. Given that the rising edges of the up and down pulses are triggered by rising edges of the reference clock (refclk) and the feedback clock (fbclk), the charge Q can be linearized by making the down pulse a constant-width, $t_p$. The down pulse is made wide enough to accommodate the quantization noise on fbclk, so that the up pulse always rises (with certain exceptions noted below) before the down pulse falls. Also, in the linearizing PFD, the up pulse is made to fall when the down pulse falls due to the fall of the fbclk. Note that the feedback clock (fbclk) should be a constant-width pulse, instead of a 50% duty cycle clock. The fbclk pulse can be generated in the feedback clock divider and retimed with the VCO clock, and the pulse $t_p$ is typically two to four VCO clock periods long. In an embodiment, the fbclk pulse is made inside the feedback clock divider using a small state machine in the feedback divider that generates the back edge (falling edge) of the fbclk a fixed number of VCO clock periods after the front edge of the fbclk. Both the front and back edges of the fbclk pulse are retimed with the VCO clock. In other embodiments, the small state machine is moved into the linearizing PFD and retimed with the VCO clock in the PFD. Alternatively, the fbclk (pulse) could be generated with a one-shot either in the divider or in the PFD.

Figure 4:
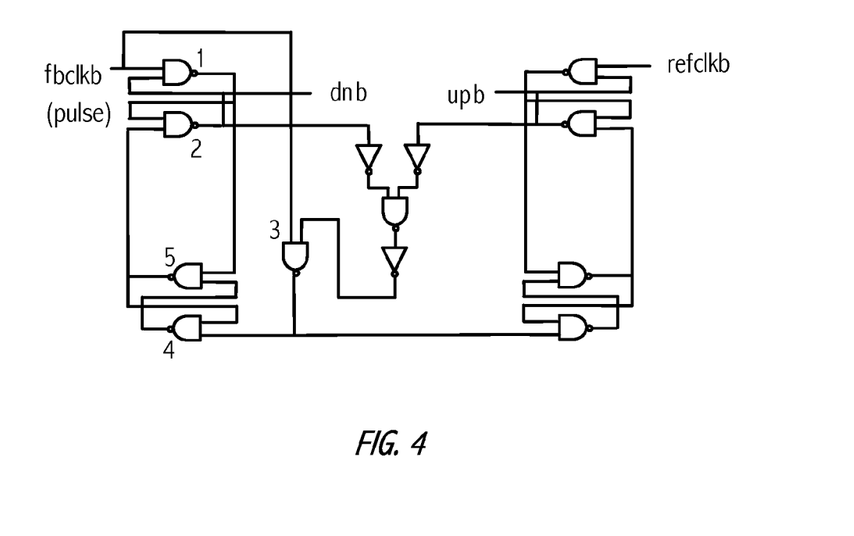
FIG. 4 illustrates a NAND gate implementation of the linearizing PFD shown in FIG. 2.

For the linearizing PFD to behave in the same way as the classical PFD during frequency acquisition, fbclk (pulse) should not be stuck high. The up pulse falls when the down pulse falls, that is, when the fbclk pulse on node 201 falls, the AND gate 203 output resets the D flip-flops, assuming that refclk has been received and the up pulse rose before the fbclk pulse falls. A NAND gate realization of the linearizing PFD is shown in FIG. 4, where all inputs and outputs are in inverted sense.

Figure 3:
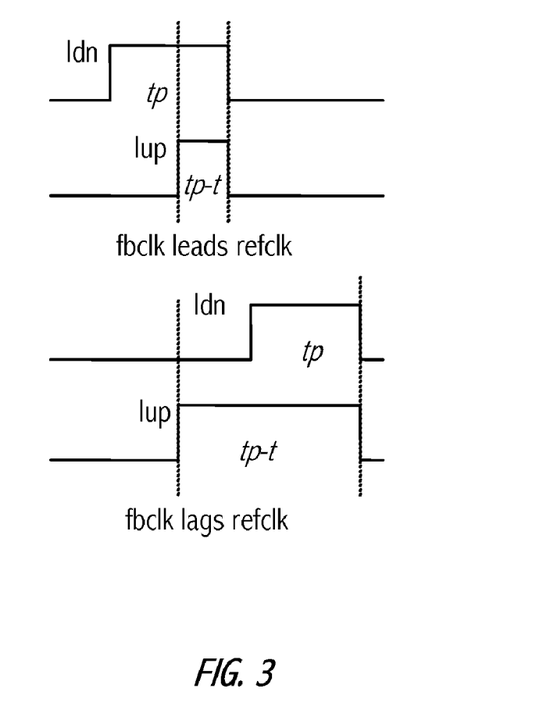
FIG. 3 illustrates timing diagrams associated with the linearizing PFD of FIG. 2.

FIG. 3 shows the timing of the up and down CP current pulses when fbclk leads or lags the refclk for the embodiment shown in FIG. 2. In both cases, the charge $Q=I_{up}\cdot(-t)+I_{up}\cdot t_p - I_{dn}\cdot t_p$. Since the $I_{dn}$ contribution to Q is constant, mismatch nonlinearity is eliminated. When refclk lags fbclk by more than $t_p$, during PLL frequency acquisition, for instance, the down pulse should be extended to fall together with the up pulse, at time $t_d$ after up pulse rises. Thus, AND gate 205 ensures the down pulse is extended by ensuring that flip-flop 207 is not reset. In this case, the modified PFD behaves like the tri-state PFD shown in FIG. 1A.

Quantization Noise Reduction

Having linearized the charge pump with a constant-width down current pulse and causing the up pulse to fall with the down pulse, a quantization noise reduction technique according to an embodiment uses the down current itself as the cancellation DAC.

Figure 5A:
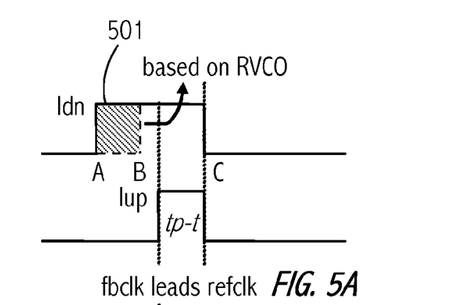
FIG. 5A illustrates timing with an imagined RVCO where fbclk leads refclk.
Figure 5B:
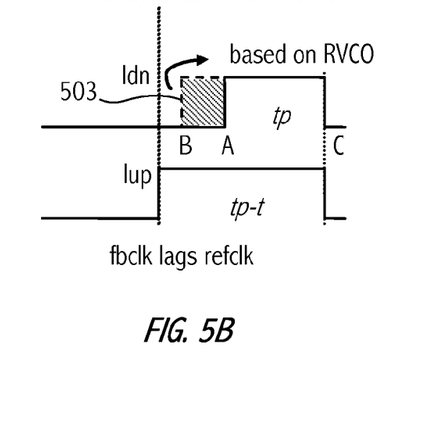
FIG. 5B illustrates timing with an imagined RVCO where refclk leads fbclk.

The quantization noise of fractional-N division from the DSM is directly proportional to the VCO clock period, $T_{VCO}$. Imagine there is a "quantization noise reduction VCO" (RVCO) that runs at four times the VCO frequency and is phase aligned to the VCO. If an RVCO clock edge, instead of a VCO clock edge, is used to generate the fbclk and the down pulse rising edges, it would be four times closer to the rising edge of the up pulse. The quantization noise is reduced by a factor of four, if a "quantization noise reduction delta-sigma modulator" (RDSM), similar to the DSM, is used with another clock divider to generate fbclk from RVCO. The divide ratio of this clock divider is approximately four times that of the original clock divider. Meanwhile, the falling edge of the down pulse should remain in the previous location based on the VCO clock edge. This is depicted in FIGS. 5A and 5B. Edges A and C are the rising and falling edge locations of the original down pulse, both aligned with VCO clock edges. Edges B and C are the rising and falling edge locations of the down pulse based on RDSM. Edge B is aligned with a RVCO clock edge, but not necessarily a VCO clock edge. In FIG. 5A, where fbclk leads refclk, the shaded area 501 represents quantization noise charge reduction if the feedback clock edge was moved from A to B. In FIG. 5B, where refclk leads fbclk, the shaded area 503 represents quantization noise charge reduction achieved assuming the charge represented by the shaded area 503 is supplied to the charge pump.

Figure 5C:
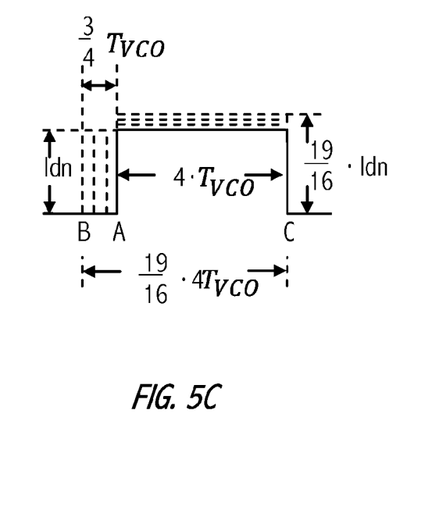
FIG. 5C illustrates an example where the RVCO clock period is $T_{VCO}/4$.

Consider an example where $t_p=4\cdot T_{VCO}$, and RVCO clock period is $T_{VCO}/4$. Remember, $t_p$ represents a constant-width down pulse. Referring to FIG. 5C, assume the DSM (controlling the feedback divider) chooses VCO clock edge A for the rising edge of the down pulse, whereas the RDSM chooses RVCO clock edge B for the rising edge of the down pulse, and B is $(3/4)T_{VCO}$ before A. The falling edge of the down pulse is C for both cases, where RVCO and VCO clock edges overlap. C is $4\cdot T_{VCO}$ behind A. That is, the RDSM requires a down current pulse that is $I_{dn}$ in amplitude and $$\frac{3}{4}T_{VCO} + 4\cdot T_{VCO} = \left(\frac{19}{16}\right)\cdot 4T_{VCO}$$

in width. In reality, RVCO and associated clock edges do not exist. However, the same charge can be injected by a down current pulse that is $$\left(\frac{19}{16}\right) \cdot I_{dn}$$

in amplitude and $4 \cdot T_{VCO}$ in width, based on the VCO clock and the DSM rather than requiring an RVCO. Instead of a single current source of amplitude $I_{dn}$, the CP down current is implemented as 32 current source units of $$\left(\frac{1}{16}\right) \cdot I_{dn} \text{ each,}$$

and 19 of them are turned on in this case.

As is typical with current-DAC based quantization noise cancellation schemes, desired pulse-width modulation is replaced by feasible pulse-amplitude modulation. Here, turning on each current source unit adds $T_{VCO}/4$ to the effective down pulse width, and turning on between zero and 32 units corresponds to an effective pulse width of zero to $8T_{VCO}$. On average over time, both DSM and RDSM would choose a location of the down pulse rising edge that aligns with the up pulse rising edge. Therefore, there are 16 current source units active on average to provide a charge, on average, equal to that delivered by the up pulse. Instead of eliminating quantization noise entirely, the quantization noise reduction technique aims to suppress it so that it is significantly below the noise of the rest of the system.

System Implementation

Figure 6:
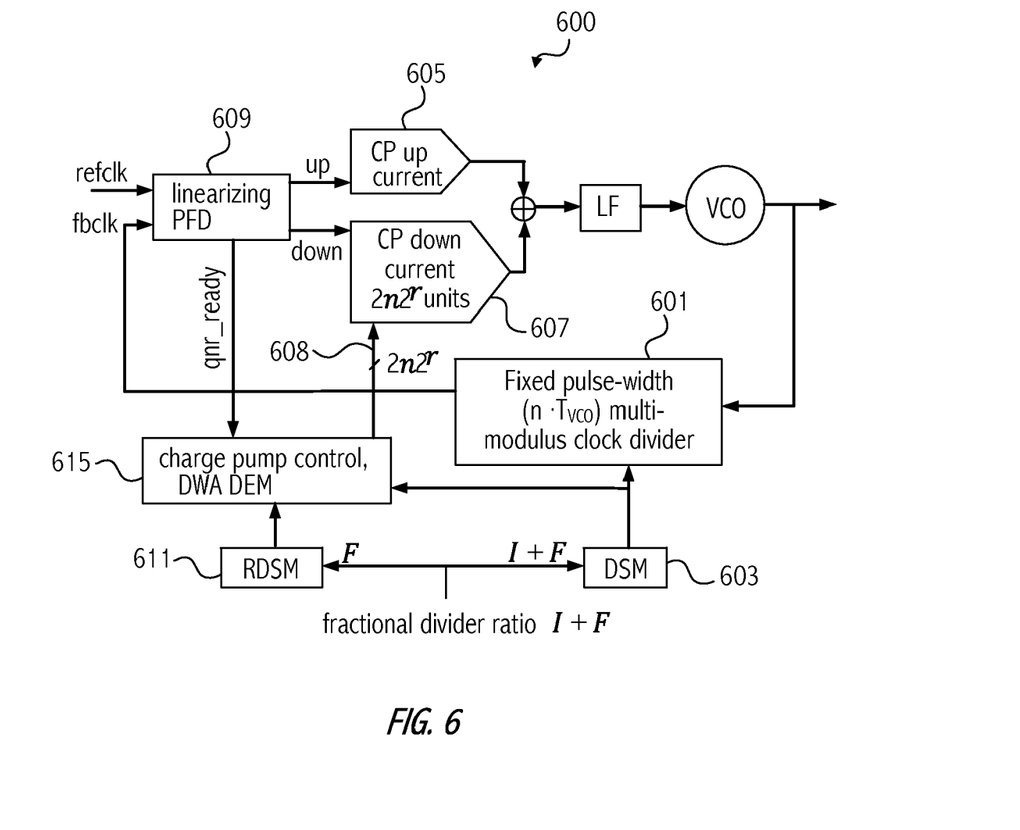
FIG. 6 illustrates an exemplary fractional-N PLL 600 with charge pump linearization and quantization noise reduction according to an embodiment of the invention.

An exemplary fractional-NPLL 600 with charge pump linearization and quantization noise reduction according to an embodiment of the invention is shown in FIG. 6. The feedback multi-modulus clock divider 601 is controlled by the DSM 603 as usual, except that its output is a short pulse of a fixed number n of VCO clock periods. Note that for the value of n, smaller is better, but $n \cdot T_{VCO}$ should be long enough to accommodate half of peak-to-peak DSM quantization noise with margin. The fbclk and refclk drive the charge pumps (CPs) 605 and 607 through the linearizing PFD 609. To reduce the quantization noise of the DSM by r bits or 6r dB, the down current source 607 is doubled as compared to the up current source 605 and split into $2n \cdot 2^r$ equal units, $n \cdot 2^r$ of which are used on average. In an exemplary embodiment, the current source 605 supplies 160 μA and the current source 607 is implemented as thirty-two 10 μA current source units, where n=4 and r=2. Each unit corresponds to a fbclk phase increment of $T_{VCO}/2^r$. The hypothetical RVCO runs $2^r$ times faster than the VCO, and the divide ratio of the associated clock divider would be approximately $2^r$ times greater.

In an exemplary embodiment, the PLL 600 is a type-II fractional-N PLL with a dual-path loop filter in which the integrating path charge pump currents are scaled down from those of the direct path, yet they are controlled by the same up and down pulses from the same PFD. Since the integrating path has low gain for the quantization noise, the reduction technique may be applied to the direct path only. The PLL shown in FIG. 6 is exemplary and noise reduction may be applied to other types of PLLs including those with different loop filters and a different number of down current sources.

The fractional divider ratio is I+F, where I is the i-bit integer part and F is the f-bit fractional part. The fractional portion F is supplied to RDSM 611. The charge pump control logic 615 supplies $2n \cdot 2^r$ control signals 608 to control the $2n \cdot 2^r$ current units in the charge pump down current portion 607 of the charge pump. In the embodiment illustrated, the charge pump control logic 615 is implemented using data weighted averaging dynamic element matching ((DWA DEM) in order to suppress the noise generated by the amplitude variation among the $2n \cdot 2^r$ down current source units. Other embodiments may utilize any other appropriate mismatch-shaping dynamic element matching algorithm according to the requirements of the particular implementation.

Figure 7:
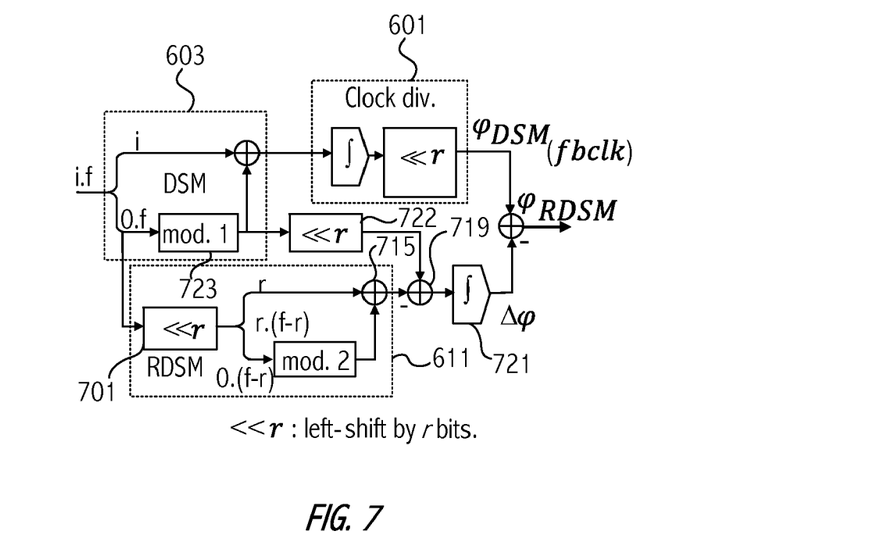
FIG. 7 illustrates an embodiment of charge pump control logic according to an embodiment of the invention.

The charge pump control logic is conceptually shown in FIG. 7. The DSM 603 modulates F into a time-varying integer and adds it to I. The sum is the clock divider ratio. In RDSM 611, the fraction F is left shifted by r bits in 701 to generate the (f-r) LSBs of F, which are modulated by RDSM into another time-varying integer, and added to the r MSBs of F in summer 715. If this sum is then added to $I \cdot 2^r$, the result would be the divide ratio of a clock divider based on the hypothesized RVCO clock that generates the rising edge of the down current pulse located at B in FIGS. 5A and 5B. Instead, this sum is used with the DSM output to calculate the phase lead of the desired RVCO clock edge over fbclk, denoted $\Delta\phi$, in units of $T_{vco}/2^r$. The output of summer 715 is subtracted from a left-shifted output of the modulated F in summer 719. That difference is integrated in integrator 721 to provide the phase lead $\Delta\phi$. The phase of a clock edge is the time at which it occurs, in units of $T_{vco}/2^r$. Referring back to FIGS. 5A, 5B, and 5C, $\Delta\phi$ can be seen as the phase lead of edge B over edge A. If $\Delta\phi$ is positive, that means that the RVCO edge (B) comes before (earlier in time than) the fbclk edge (A). The phase of the desired RVCO clock edge, denoted $\phi_{RDSM}$, is obtained by subtracting $\Delta\phi$ from the phase of fbclk, denoted $\phi_{DSM}$. $\Delta\phi + n \cdot 2^r$ is the number of down current source units to be turned on for the present fbclk cycle, where $\Delta\phi$ has a zero average over time. Referring back to FIGS. 2 and 3, the fixed width dn pulse determines how long the down current is supplied (the width of the current pulse) and the fixed value ($n \cdot 2^r$) and the variable value $\Delta\phi$ determine the magnitude of the dn current. Thus, e.g., assume n=4 and r=2, when $\Delta\phi=0,16$ current sources are turned on ($n \cdot 2^r$). Referring to FIG. 5B, if $\Delta\phi$ is positive, then additional charge is required to reduce the quantization error and more than 16 current source elements are selected. If $\Delta\phi$ is negative, as shown in FIG. 5A, fewer than 16 current source elements are selected. In an exemplary embodiment, both the DSM and RDSM are third-order modulators. In an actual embodiment, there is no need to calculate $\phi_{RDSM}$ or $\phi_{DSM}$ as shown in FIG. 7. Only $\Delta\phi$, the phase difference between the actual feedback clock and the hypothesized feedback clock, needs to be calculated. Note that while one particular embodiment may utilize 32 equal sized current source elements, other embodiments may use weighted current source elements of different sizes and/or a different number of current source elements to provide the down pulse charge.

Figure 8:
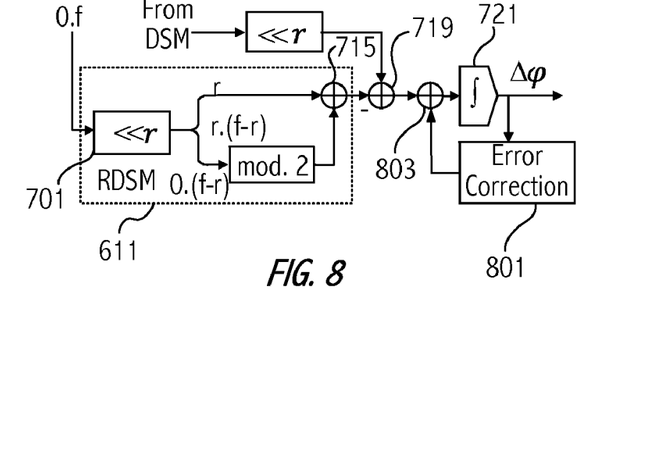
FIG. 8 illustrates a self correcting mechanism that may be used in an embodiment.

Referring to FIG. 8, illustrated is a self correcting monitor 801 that averages the number of current source elements that are active. If the average is different from a predetermined number of current source elements, e.g., 16, then a signal is provided to summer 803 to adjust the value supplied to integrator 721, which in turn adjusts $\Delta\phi$ to get the average back to zero. In that way, any errors that happen to occur can be corrected.

FIG. 7 also shows that the quantization noise of the DSM contributes to $\phi_{RDSM}$ via two paths with gains of the same amplitude but opposite sign. The first path is from the output of the modulator one (mod. 1) 723 in DSM 603 through clock divider 601. The second path is from the output of the modulator one 723 through left-shifter 722 and integrator 721. That quantization noise is cancelled out in $\phi_{RDSM}$ if there is no analog mismatch.

Pulse-Width Invariant PFD

The residual errors associated with the quantization noise reduction come from several sources. (1) The cancellation DAC in the form of the down current source units has its own quantization noise, which is proportional to the period of RVCO. (2) The amplitude mismatch between the up and down current sources results in imperfect cancellation of the DSM quantization noise. (3) The width of the down pulse may deviate from $n \cdot T_{VCO}$, resulting in error in the charge delivered. At low frequencies this is equivalent to an amplitude mismatch of the down current with up current. Any mismatch between the rise and fall time of the down pulse is equivalent to a width deviation of the down pulse and is included here. (4) Mismatch among the down current source units creates error, although this error is substantially modulated out of the bandwidth of the PLL by dynamic element matching. (5) The shape mismatch of the up and down current pulses due to pulse-width versus pulse-amplitude modulation manifests as imperfect cancellation at high frequencies. (6) Due to different path delays in the PFD and CP circuits, the up and down current pulses may be systematically skewed in phase, even when shape mismatch is disregarded.

Figure 9:
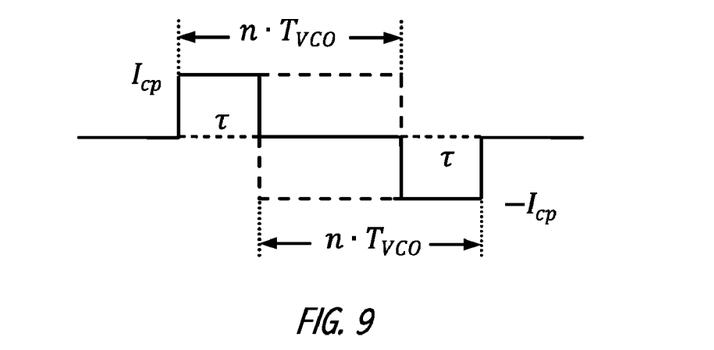
FIG. 9 illustrates an identically shaped pair of up and down current pulses with a systematic skew.

The second error is equal to the original DSM noise times the relative mismatch, and has the same spectral shaping as the original quantization noise. The second and third errors can be reduced by trimming the up current source relative to the down current source. For an identically shaped pair of up and down current pulses of amplitude$\pm I_{cp}$ and systematic skew of $\tau$, as shown in FIG. 9, the amplitude of Fourier transform is $$|F(f)| = 2\tau I_{cp} \cdot \frac{\sin(\pi \tau f)}{\pi \tau f} \cdot \sin(\pi n T_{VCO} f)$$

where the low frequency content is proportional to $\tau$. Therefore, the sixth error above is reduced by minimizing $\tau$.

Figure 10:
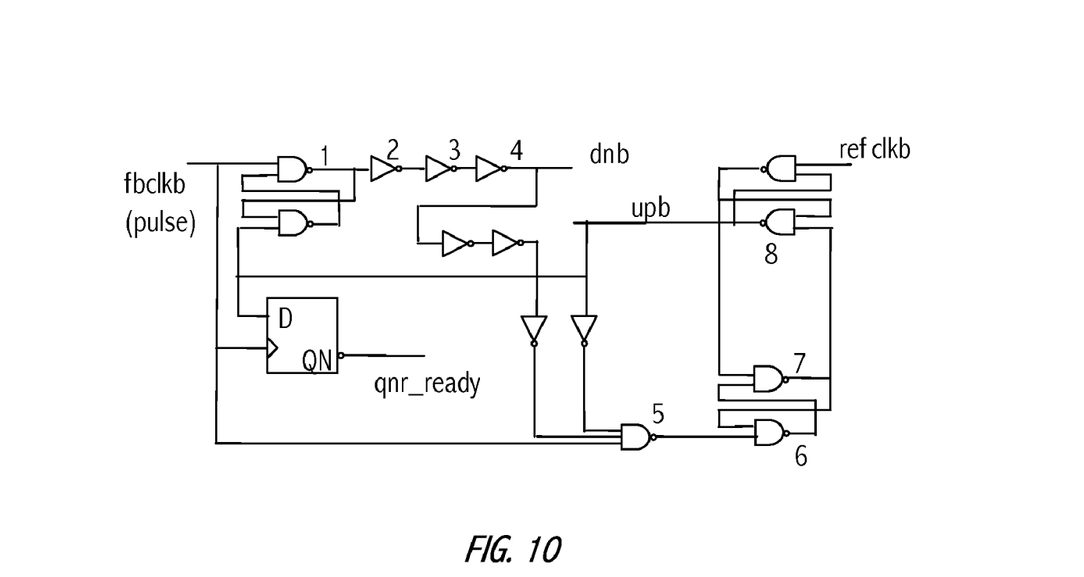
FIG. 10 illustrates pulse width invariant PFD according to an embodiment of the invention.

In the linearizing PFD embodiment of FIG. 4, the rising edges (back edges) of upb and dnb are well aligned, both at four gate delays after the rising edge of fbclkb. However, the dnb pulse is longer than the fbclkb pulse of length $n \cdot T_{VCO}$, because its rising edge delay is two gate delays (1-2) while the falling edge delay is four gate delays (3-4-5-2). This causes the third error listed above. The linearizing PFD is therefore modified into the pulse-width invariant PFD (PWI PFD) to overcome this shortcoming, an embodiment of which is shown in FIG. 10, which also has inverted logic sense on inputs and outputs. While the upb pulse is produced by a D flip-flop in this PFD, the dnb pulse is generated by a single RS latch. The logic and timing of operation of the embodiment shown in FIG. 10 takes advantage of the fact that the rising edge of fbclkb should trigger the reset of dnb and is self explanatory to those skilled in the art. At the rising edge of fbclkb, both upb and dnb are cleared after four gate delays (1-2-3-4 versus 5-6-7-8)). Since the falling and rising edges of dnb are triggered by the falling and rising edges of fbclkb, respectively, both after four gate delays (1-2-3-4), the dnb pulse preserves the fbclkb pulse width of $n \cdot T_{VCO}$.

During frequency and phase acquisition, the refclkb falling edge may arrive after the rising edge of fbclkb. The PWI PFD extends the down pulse width beyond $n \cdot T_{VCO}$, just as the linearizing PFD does. In this case, the basis for the quantization noise reduction technique is not valid, and the technique may interfere with the locking process. A "quantization noise reduction ready" indicator, qnr_ready, is created by latching the down pulse output dnb with fbclkb into a D flip-flop. Quantization noise reduction is active only when qnr_ready is high. Otherwise, exactly $n \cdot 2^r$ down current source units should be used.

Note that for the PWI PFD to behave in the same way as the classical PFD during frequency acquisition, fbclkb (pulse) should not be stuck low. The PWI PFD can replace the linearizing PFD in FIGS. 2 and 4 for use in quantization noise reduction, whereas the linearizing PFD of FIGS. 2 and 4 is suitable for stand-alone use in charge pump linearization.

The description of the invention set forth herein is illustrative, and is not intended to limit the scope of the invention as set forth in the following claims. Variations and modifications of the embodiments disclosed herein, may be made based on the description set forth herein, without departing from the scope and spirit of the invention as set forth in the following claims.

What is claimed is:

1. A method comprising:
   receiving a feedback signal having a fixed pulse width at a first input of a phase frequency detector;
   responsive to assertion of the feedback signal, asserting a first pulse signal indicative of a first charge amount;
   receiving a reference clock signal at a second input of the phase frequency detector;
   responsive to assertion of the reference clock signal, asserting a second pulse signal indicating a second charge amount;
   deasserting the first and second pulse signals responsive to an edge of the feedback signal deasserting the feedback signal; and
   equally delaying rising and falling edges of the first pulse signal with respect to their triggering conditions.

2. The method as recited in claim 1 further comprising:
   when the reference clock signal lags the feedback signal by more than the fixed pulse width, extending the first pulse signal so that the first pulse signal falls together with the second pulse signal, a fixed delay after the second pulse signal rises.

3. The method as recited in claim 1 wherein the first pulse signal is for a charge pump and corresponds to a decrease in frequency of a controlled oscillator output signal and the second pulse signal is for the charge pump and corresponds to an increase in frequency of the controlled oscillator output signal.

4. The method as recited in claim 1 further comprising generating the feedback signal using a feedback divider signal from a feedback divider retimed with an output of a voltage controlled oscillator.

5. The method as recited in claim 1 further comprising providing equal circuit delays for deassertion of the first pulse signal and the second pulse signal, with respect to a common triggering condition.

6. The method as recited in claim 1 further comprising:
   latching the second pulse signal with the feedback signal to provide a quantization noise reduction ready indicator signal.

7. The method as recited in claim 6 further comprising enabling quantization noise reduction according to a value of the quantization noise reduction ready indicator.

8. The method as recited in claim 7 wherein before quantization noise reduction is enabled based on a first value of the quantization noise reduction ready indicator signal, a fixed number of current sources are used in a charge pump circuit, and after quantization noise reduction is enabled based on a second value of the quantization noise reduction ready indicator signal, a variable number of current sources are used in the charge pump circuit.

9. The method as recited in claim 1 further comprising:
generating a quantization noise reduction ready indicator signal using the second pulse signal and the feedback signal, the quantization noise reduction ready indicator signal indicating when to enable varying a number of current sources used in a charge pump to reduce quantization noise.

10. An apparatus comprising:
a phase frequency detector (PFD) including,
a first circuit coupled to receive a fixed pulse width feedback signal and supply a first pulse signal having a fixed pulse width corresponding to the fixed pulse width feedback signal, a first edge of the first pulse signal being determined by a first edge of the fixed pulse width feedback signal and a second edge of the first pulse signal being determined by a second edge of the fixed pulse width feedback signal;
a second circuit coupled to receive a reference clock signal and to supply a second pulse signal, a first edge of the second pulse signal being determined by a first edge of the reference clock signal and a second edge of the second pulse signal being determined by a reset signal; and
a reset circuit responsive to, at least in part, the second edge of the fixed pulse width feedback signal to generate the reset signal;
wherein first gate delays to generate the first edge of the first pulse signal responsive to the first edge of the fixed pulse width feedback signal is equal to second gate delays to generate the second edge of the first pulse signal responsive to the second edge of the fixed pulse width feedback signal.

11. The apparatus as recited in claim 10 wherein second gate delays to generate the second edge of the first pulse signal responsive to a triggering condition are equal to third gate delays to generate the second edge of the second pulse signal responsive to the triggering condition and wherein the triggering condition is the second edge of the fixed pulse width feedback signal.

12. The apparatus as recited in claim 10 wherein the first circuit comprises an SR latch and the second circuit comprises a D flip-flop.

13. The apparatus as recited in claim 10 wherein when the reference clock signal lags the feedback signal by more than the fixed pulse width, the apparatus is operable to extend the first pulse signal by delaying assertion of the reset signal so that the first pulse signal falls together with the second pulse signal, a fixed delay after the second pulse signal rises.

14. The apparatus as recited in claim 10 further comprising:
a circuit coupled to receive the second pulse signal and the feedback signal and to store the second pulse signal using the feedback signal and supply an indication thereof as a quantization noise reduction ready indicator.

15. The apparatus as recited in claim 10 further comprising a phase-locked loop including the PFD, a charge pump, a loop filter, a controlled oscillator, and a feedback divider.

16. A linearizing phase frequency detector comprising:
a first pulse signal generating circuit responsive to a feedback pulse having a fixed width to generate a first pulse signal with a first and a second edge defining the first pulse signal to have substantially the same fixed width as the feedback pulse;
a second pulse signal generating circuit responsive to a reference clock signal to generate a first edge of a second pulse signal on assertion of the reference clock signal and to generate a second edge of the second pulse signal responsive to deassertion of the feedback pulse; and
a storage element responsive to store the second pulse signal based on the feedback pulse, to provide a quantization noise reduction ready indicator signal.

\* \* \* \* \*